US005755332A

United States Patent [19]
Holliday et al.

[11] Patent Number: 5,755,332
[45] Date of Patent: *May 26, 1998

[54] ENCLOSED SEALABLE PURGIBLE SEMICONDUCTOR WAFER HOLDER

[75] Inventors: James E. Holliday; Gary M. Gallagher, both of Colorado Springs, Colo.

[73] Assignee: Empak, Inc., Chanhassen, Minn.

[*] Notice: The portion of the term of this patent subsequent to Mar. 11, 2014, has been disclaimed.

[21] Appl. No.: 712,140

[22] Filed: Sep. 11, 1996

Related U.S. Application Data

[63] Continuation of Ser. No. 447,954, May 23, 1995, abandoned, which is a continuation of Ser. No. 209,227, Mar. 11, 1994, Pat. No. 5,472,086.

[51] Int. Cl.$^6$ .................................... B65D 85/42
[52] U.S. Cl. ........................... 206/711; 118/500; 141/98; 206/454; 211/41.12; 414/217; 414/417
[58] Field of Search .................................. 206/454, 711; 211/40, 41.12; 414/217, 404, 417; 141/98; 118/500

[56] References Cited

U.S. PATENT DOCUMENTS

| | | |
|---|---|---|
| Re. 33,361 | 10/1990 | Coe ................................ 206/711 X |
| 3,913,749 | 10/1975 | Wyers . |
| 3,918,756 | 11/1975 | Saville et al. . |
| 3,923,156 | 12/1975 | Wallestad . |
| 3,923,191 | 12/1975 | Johnson . |
| 3,926,305 | 12/1975 | Wallestad . |
| 3,939,973 | 2/1976 | Wallestad . |
| 3,961,877 | 6/1976 | Johnson . |
| 4,043,451 | 8/1977 | Johnson . |
| 4,061,228 | 12/1977 | Johnson . |
| 4,248,346 | 2/1981 | Johnson ................................ 206/711 |
| 4,450,960 | 5/1984 | Johnson . |
| 4,471,716 | 9/1984 | Milliren . |
| 4,520,925 | 6/1985 | Johnson . |
| 4,532,970 | 8/1985 | Tullis et al. . |

(List continued on next page.)

FOREIGN PATENT DOCUMENTS

WO9216964  10/1992  WIPO .

OTHER PUBLICATIONS

Slocum, Alexander H., "Sematech Short Course: Deterministic Machine Design Increasing Reliability and Performance", *Precision Machine Design,* Prentice Hall, Englewood Cliffs, 1992, pp. 49–64.

*Primary Examiner*—Bryon P. Gehman
*Attorney, Agent, or Firm*—Haugen & Nikolai, PA

[57] ABSTRACT

An enclosed semiconductor wafer holder, and a cover providing isolation control of semiconductor wafers that is simple, lower cost, and non-obtrusive is described. The cover includes a sealing perimeter that creates a hermetic seal when engaged with the semiconductor wafer holder. The holder also includes a purging arrangement attached to the holder that allows an active gentle purging of inert gas into the sealed semiconductor wafer holder.

13 Claims, 4 Drawing Sheets

U.S. PATENT DOCUMENTS

| | | | |
|---|---|---|---|
| 4,543,389 | 9/1985 | Tullis . | |
| 4,555,024 | 11/1985 | Voss et al. . | |
| 4,557,382 | 12/1985 | Johnson . | |
| 4,588,086 | 5/1986 | Coe | 206/711 X |
| 4,684,021 | 8/1987 | Niebling et al. . | |
| 4,718,549 | 1/1988 | Rissotti et al. . | |
| 4,718,552 | 1/1988 | Rossi et al. . | |
| 4,721,207 | 1/1988 | Kikuchi . | |
| 4,739,882 | 4/1988 | Parikh et al. . | |
| 4,747,488 | 5/1988 | Kikuchi | 206/711 X |
| 4,752,007 | 6/1988 | Rossi et al. . | |
| 4,793,488 | 12/1988 | Mortensen . | |
| 4,815,912 | 3/1989 | Maney et al. . | |
| 4,817,795 | 4/1989 | Kos | 206/454 X |
| 4,817,799 | 4/1989 | Gregerson et al. . | |
| 4,827,110 | 5/1989 | Rossi et al. . | |
| 4,833,306 | 5/1989 | Milbrett . | |
| 4,872,554 | 10/1989 | Quernemoen . | |
| 4,880,116 | 11/1989 | Kos . | |
| 4,888,473 | 12/1989 | Rossi et al. | 235/376 |
| 4,930,634 | 6/1990 | Williams et al. . | |
| 4,949,848 | 8/1990 | Kos . | |
| 4,966,284 | 10/1990 | Gregerson et al. | 206/711 |
| 4,966,519 | 10/1990 | Davis et al. . | |
| 4,995,430 | 2/1991 | Bonora et al. . | |
| 5,024,329 | 6/1991 | Grohrock . | |
| 5,025,926 | 6/1991 | Gregerson et al. | 206/711 |
| 5,046,615 | 9/1991 | Netl et al. . | |
| 5,111,936 | 5/1992 | Kos . | |
| 5,154,301 | 10/1992 | Kos . | |
| 5,184,723 | 2/1993 | Karl et al. . | |
| 5,207,324 | 5/1993 | Koss . | |
| 5,217,053 | 6/1993 | Foster et al. . | |
| 5,228,568 | 7/1993 | Ogino et al. | 206/711 |
| 5,253,755 | 10/1993 | Maenke . | |
| 5,255,783 | 10/1993 | Goodman et al. | 206/711 |
| 5,255,797 | 10/1993 | Kos . | |
| 5,295,522 | 3/1994 | De Angelis et al. . | |
| 5,472,086 | 12/1995 | Holliday et al. | 206/711 |

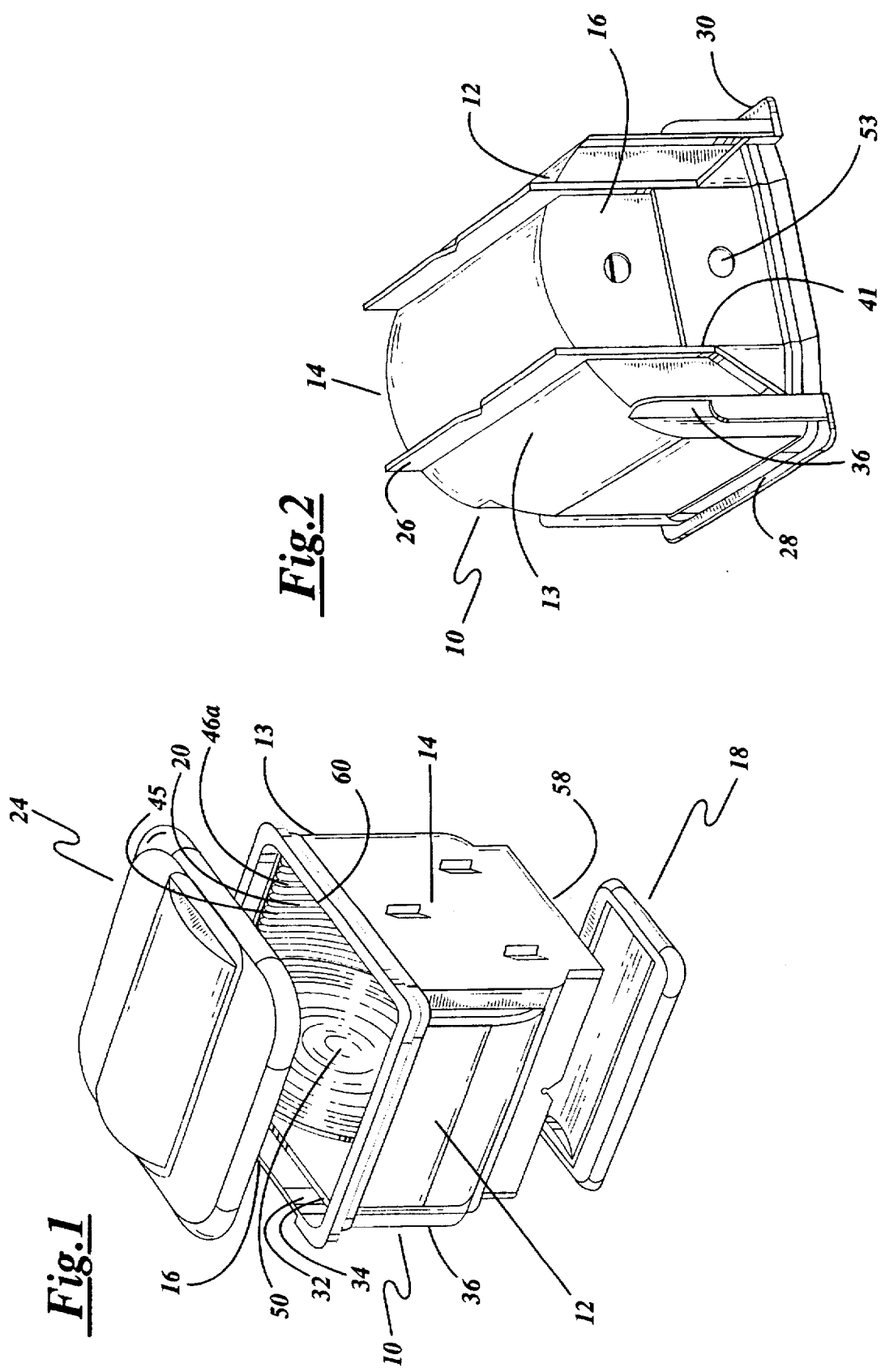

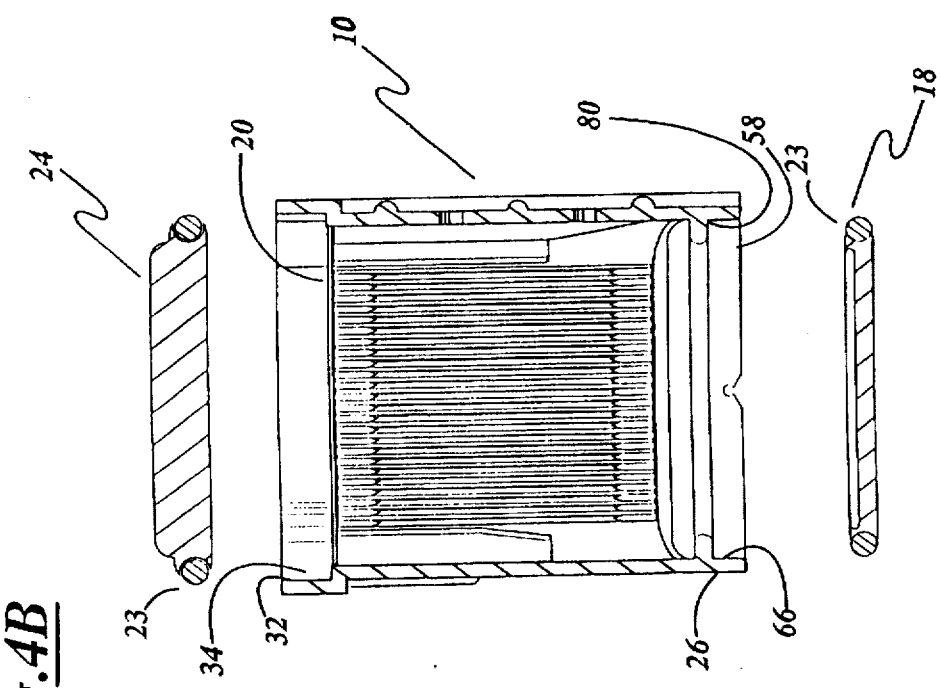
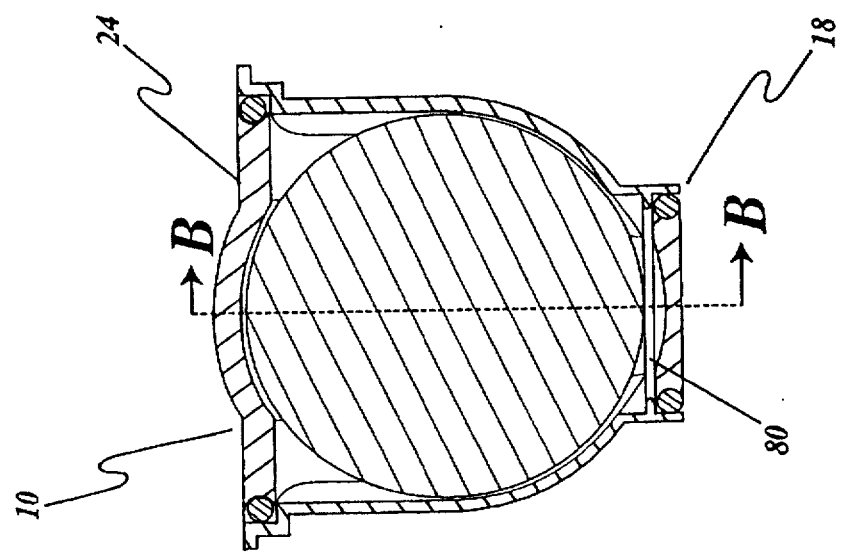
Fig.4
Fig.4B

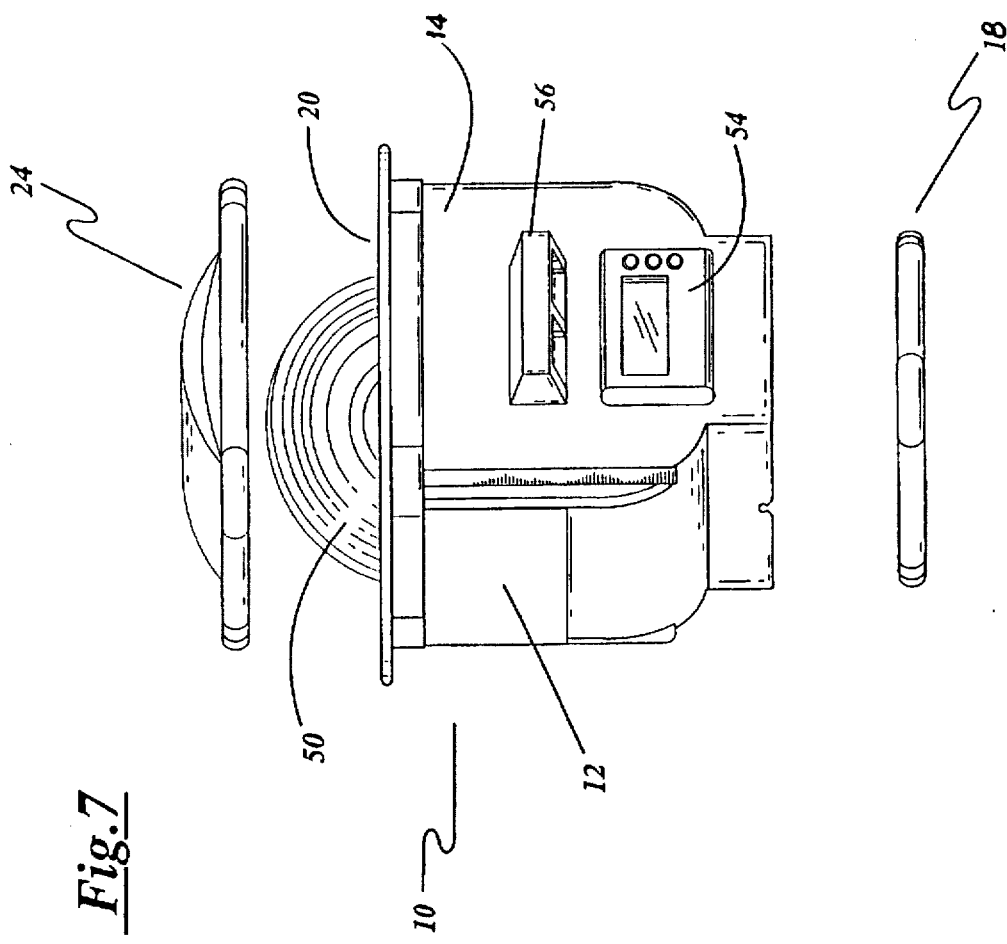
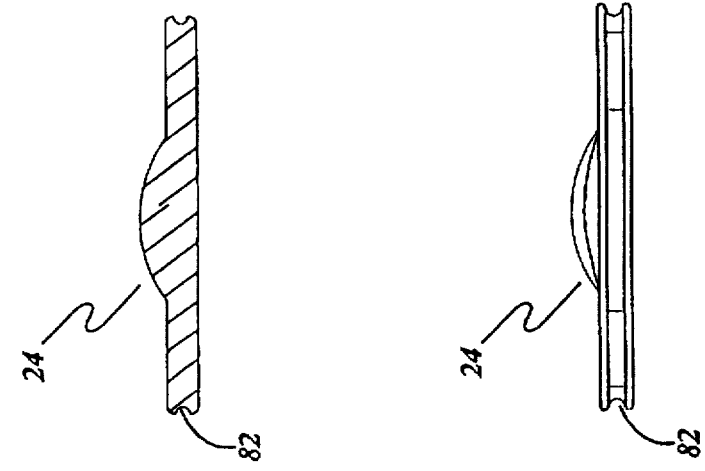
Fig.7
Fig.5
Fig.6

ENCLOSED SEALABLE PURGIBLE SEMICONDUCTOR WAFER HOLDER

This is a continuation of application Ser. No. 08/447,954, filed on May 23, 1995 abandoned which was a continuation of then pending application Ser. No. 08/209,227 which was filed on Mar. 11, 1994 and which has since issued as U.S. Pat. No. 5,472,086.

BACKGROUND OF THE INVENTION

I. Field of the Invention

This invention relates generally to semiconductor wafer holders used in the storage, transportation and processing of semiconductor wafers. More particularly, it relates to a hermetically sealable purgible cassette used for containing semiconductor wafers during processing, transportation and storage.

II. Discussion of the Prior Art

Production of semiconductor wafers requires an extremely clean environment. The presence of any small particles, vapors or static discharge in the environment is damaging to the production of semiconductors, and the wafers themselves. In an effort to combat airborne particle problems, various techniques are in use today.

The most common technique in use today, is to provide a cassette for holding the semiconductor wafers which meet Semiconductor Equipment Manufacturers Institute (SEMI) standards. The SEMI standards recite specifications with the purpose of defining interchangable, standardized containers suitable for standardized processing cassettes. A standardized mechanical interface (SMIF) system has been proposed by Hewlett-Packard Company as disclosed in U.S. Pat. Nos. 4,532,970 and 4,534,389 with the purpose of reducing particle fluxes on the semiconductor wafers.

In the SMIF system, a cassette meeting SEMI standards is placed inside a clean Work In Process (WIP) box or pod. The SMIF pod or box keeps the cassette and wafers free of particles during transportation and storage. The pod or box also isolates the wafers from the operator. The semiconductor wafer cassette, the wafers, and the inside of the box or pod must all be free of particles damaging to the semiconductor manufacturing process.

The SMIF pods or boxes are used during processing in either a general clean room environment or a clean mini-environment (i.e.: under a canopy). Once in a clean environment, the SMIF boxes or pods are opened for removal of the cassette and for processing of the wafers. This can be done in a clean environment without contaminating the cassette or wafers.

To permit automated processing of the wafers, the cassette must be indexed with the process tool. An H-bar is formed on the outside of a standardized cassette, which aids in the indexing of the cassette with the process tool. However, over time the H-bar warps and does not consistently index a cassette in the same location relative to the process tool. Therefore, the H-bar is not a dependable method for attaining high repeatability in indexing the cassette to the process tool.

During automated processing, the indexing of the cassette with the process tool must be performed in a clean environment to prevent contamination. In present manufacturing systems, the SMIF pod or box must be opened and the cassette removed in such a way that requires additional process tools and steps. The increase in required steps and tools adds to the likelihood that the process tool equipment will be unable to interface with the necessary removal tools.

The increase in required steps also requires a greater cycle time to index a cassette with the process tool. Further, when using a SMIF pod or box, the loading height of the process tool equipment must be large enough to allow for the removal of the standard cassette from the box or pod. Consequently, the SMIF pods or boxes are large and heavy requiring more storage space and increasing the likelihood of carpal tunnel damage to the handlers of boxes or pods. These problems are all overcome by eliminating the need to use SMIF boxes or pods. Elimination of the boxes or pods also reduces the amount of necessary clean-up, thereby further reducing the cost of processing semiconductor wafers.

The present invention overcomes the disadvantages of the current manufacturing system by providing a hermetically sealed cassette that can be purged with an inert gas. This sealed cassette may be indexed directly onto the process tool, eliminating the following steps: opening the SMIF box or pod, lowering the pod or box door simultaneously with the cassette, and manipulating the cassette onto the process tool. The hermetically sealed cassette has one surface of a three-groove kinematic coupling to positively locate the cassette with the process tool. This coupling provides a dependable method to position the cassette relative to the process tool with a high rate of repeatability.

Further, the cassette is smaller and about 20% to 50% lighter than the SMIF box or pod. Hence, there is a reduced likelihood that handlers will suffer from carpal tunnel. The reduced size eliminates the need that loading height of the process tool equipment be large enough for the removal of the standard cassette from a SMIF box or pod. Also, the required storage, transportation, and positioning space are reduced. A tracking system provided on the outer surface of the hermetically sealed cassette allows the cassette to be tracked in an unfriendly external environment during the transportation, storage or processing of the semiconductor wafers.

SUMMARY OF THE INVENTION

The purpose of the present invention is to provide a sealable, purgible, cassette that is compatible with SEMI standards. The cassette has at least one open end, a cover with a means for sealing the open end of the cassette a means for supporting the semiconductor wafer's within the cassette, a means for purging the cassette, a means for precisely indexing the cassette relative to processing equipment and a means for tracking the cassette. The cover when engaged forms a hermetic seal with the cassette. The cassette is designed to securely support semiconductor wafer's within the sealed cassette. The hermetically sealed cassette allows direct indexing to semiconductor wafer processing equipment without the influence of external factors on the contents of the container. The means for precisely indexing the cassette relative to processing equipment provides a dependable method of indexing the cassette to the process tool. The means for precisely indexing the cassette positions the cassette relative to the process tool in a precise manner with a high rate of repeatability. The indexing means may include at least three partial spheres extending from said box to form one surface of a three-groove kinematic coupling. When sealed, the means for purging the cassette allows a small volume of inert gas to be slowly purged into the cassette, providing a clean environment for the semiconductor wafers. Means for tracking the cassette is provided for tracking the cassette without the need for a clean external environment.

It is accordingly a principal object of the present invention to provide a hermetically sealed cassette which meets SEMI standards.

Another object of the present invention is to provide a simple flexible, low-cost, non-obtrusive cassette for semiconductor wafers, that allows isolation control.

Another object of the present invention is to provide a purgible cassette.

Another object of the present invention is to provide a cassette that can be directly indexed with a process tool in a mini-clean environment reducing the cycle time to process a semiconductor wafers.

Another object of the present invention is to provide a directly indexable cassette having a means to positively index the cassette relative to the process tool with a high rate of repeatability.

Still another object of the present invention is to provide a cassette that can reduce the number of process tools and steps for semiconductor wafer processing.

A further object of the present invention is to provide a cassette that enhances reliability during wafer processing by eliminating the need for SMIF boxes or pods, large clean rooms, and the additional processing steps that the use of boxes or pods requires.

Yet another object of the present invention is to provide a cassette that reduces the overall weight and size of the package used to store and transport the semiconductor wafers in a clean environment.

Another object of the present invention is to provide a cassette with a tracking system that can be implemented outside of a clean environment.

These and other objects, as well as the features and advantages of the present invention, will be readily apparent to those skilled in the art from a review of the following detailed descriptions of the preferred embodiment in conjunction with the accompanying drawings and claims.

DESCRIPTION OF THE DRAWINGS

FIG. 1 is a perspective view of the cassette with the cover and optional bottom aligned with the cassette.

FIG. 2 is a perspective view of the semi-standard cassette showing an enclosed bottom and the H-bar side.

FIG. 3-A is a cross-sectional view through line A—A of FIG. 3.

FIG. 4 is a sectional view of the cassette of the type shown in FIG. 1, with the cover and optional bottom engaged and a wafer positioned within the cassette.

FIG. 4-B is a cross-sectional view through line B—B of FIG. 4, with the cover and bottom elevated from the cassette.

FIG. 5 is a sectional end view of the cover of the type shown in FIG. 1, with the seal removed.

FIG. 6 is an end view of the cover of the type shown in FIG. 1, with the seal removed.

FIG. 7 is a perspective view of the cassette, showing the cover and optional bottom aligned with the cassette, a semiconductor wafer partially extending into the cassette and the optional handle and means for tracking, affixed to an end of the cassette.

DETAILED DESCRIPTION OF THE PREFERRED EMBODIMENT

Figure 3A:
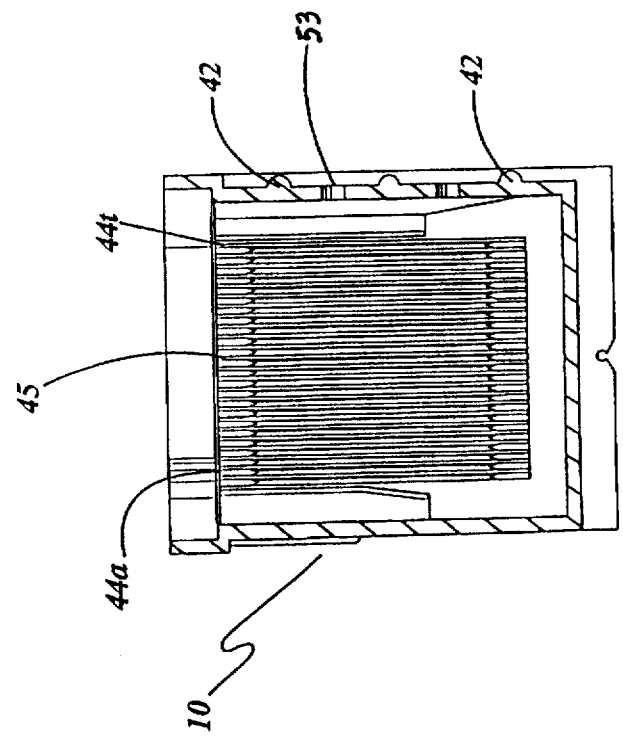
FIG. 3 is a sectional view of the cassette of the type shown in FIG. 2, showing the inner side of the H-bar, with the alternate preferred indexing spheres shown.

Referring first to FIG. 1, there is indicated generally the sealable semiconductor wafer cassette 10, a cassette cover 24, a round, disk-shaped substrate or wafer 50, and an optional cassette bottom door 18.

The semiconductor wafer cassette 10 has a chamber defined by a pair of opposing side walls 12 and 13, a pair of endwalls 14 and 16, an open top 20, and an optional open bottom 58. The cassette cover 24 is designed to close and seal the open top 20. The bottom door 18 is designed to close and seal the optional open bottom 58.

Figure 3:
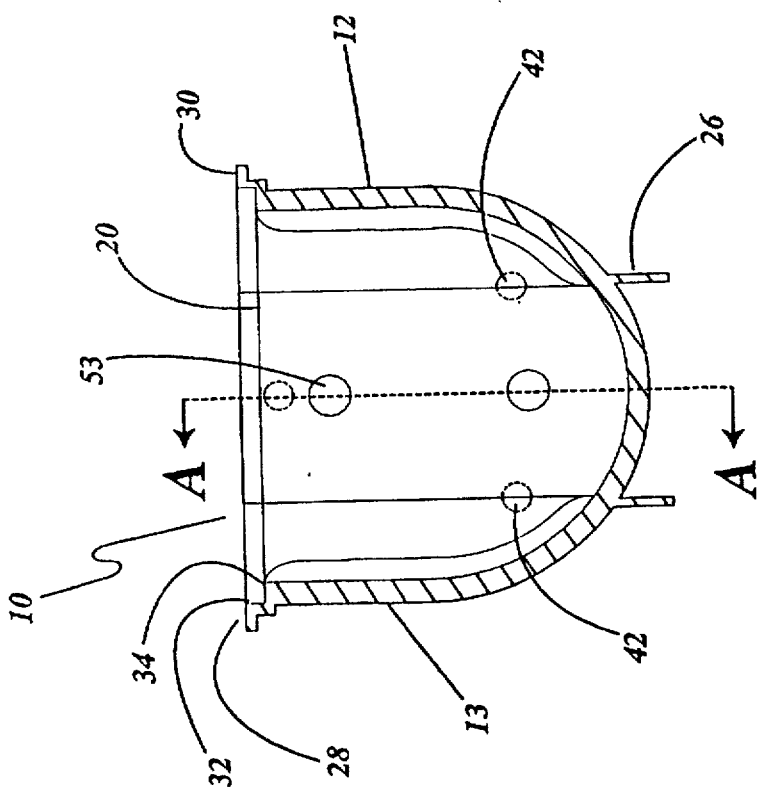

Referring to FIGS. 2 and 3 the curved semiconductor wafer supporting sidewalls 12 and 13 extend downward from the two opposing perimeter lip edges 28 and 30 to the cassette bottom frame 26. On the inner surface of the curved semiconductor wafer supporting side walls 12 and 13 are a plurality of recess pairs 44a-t and 46a-t shaped like saw teeth with the apex of each recess pair aligned on opposing interior surfaces, best shown in FIGS. 1 and 3-A. Each recess pair forms a slot 45. The slots 45 formed by recessed pair 44a-t are likewise aligned with the slots formed by recessed pairs 46a-t to form a plurality of pairs of opposing slots. Each pair of opposing slots holds a substrate or wafer 50. The wafers 50 are also in perimeter contact with the lower portion of the curved sides 12 and 13. The inside of the optional bottom door 18 may be recessed to form a continuous support surface to the wafers 50 (see FIGS. 1 and 4). The cassette may be constructed with a varying number of recess pairs 44a-t and 46a-t to change the number of pairs of opposing slots without deviating from the invention.

Forming the enclosed ends of the semiconductor wafer cassette 10 are the end walls 14 and 16. The end wall 14 forming an enclosed end of the semiconductor wafer cassette 10 has an optional processing handle 56 which extends relatively perpendicular to the end wall 14 and relatively parallel to the open top 20 (see FIG. 7). The cassette processing handle 56 forms a gripping surface. Also, attached to the end wall 14 is the optional cassette level tracking system 54, allowing a semiconductor wafer cassette 10 to be tracked during processing, transportation, and storage. Several types of tracking systems may be used including but not limited to: infrared encoders, radio frequency transmitters, and bar codes that interact with bar code readers.

Opposite the end wall 14 is the H-bar end 16 that forms the other enclosed end of the semiconductor wafer cassette 10 (See FIG. 2). An H-bar 41 extends from the surface of the H-bar end that allows the cassette 10 to be indexed with the processing tool. Referring to FIGS. 3 and 3-A an optional plurality of partial spheres 42 may extend from the H-bar end 16 allowing precise, consistent and reliable indexing. The optional partial spheres 42 form one surface of a three groove kinematic coupling.

A three groove kinematic coupling consists of two kinematic coupling surfaces. Three spheres arranged to form a triangle are attached to one surface and three kinematic recesses or grooves, designed to align and engage the spheres, are formed within the other surface. The two surfaces are brought into contact. The spheres engage with the grooves, precisely orienting the two surfaces relative to the other. This coupling arrangement allows repeatability of the precise orientation of the two kinematic coupling surfaces and grooves. The preferred material for the spheres and grooves is a hard ceramic such as tungsten carbide, silicon nitride or zirconia. Of course other materials may also be used without deviating from the invention. Either the grooves or spheres may extend from the H-bar endwall 16, to form one kinematic coupling surface. The other surface is formed on a piece of equipment such as a process tool. This arrangement allows precise orientation between the cassette and the process tool so that the cassette opening is properly aligned with respect to the process tool. In the alternate preferred embodiment, kinematic projections such as the partial spheres 42 of the kinematic coupling may replace the H-bar 41.

Purging bores 53 extend through the H-bar end 16 at predetermined locations. A means for purging the cassette 10 consisting of a plurality of self sealing breather filters may extend from the end wall 16 centered over the purging bores 53, allowing the chamber of the sealed semiconductor wafer cassette 10 to be purged with particle-free air or an inert gas. In the preferred embodiment, a 0.02 micron filter polytetrafluoroethylene (PTFE) membrane is used. These filters may be sealed within a housing that in turn extends through and seals with the purging bore 53. Other suitable mechanisms can, of course, be used without deviating from the invention. The purging bores 53, optional handle 56, means for purging, and means for tracking 54 may alternatively be attached to the cover 24 or bottom 18 of the semiconductor wafer cassette without deviating from the invention.

Referring again to FIGS. 1 and 3, the open top 20 is formed by a perimeter lip 60, a perimeter shoulder 32 that extends perpendicularly downward from an inner edge of lip 60, and a ledge 34 that extends perpendicularly inward from the perimeter shoulder 32. The perimeter shoulder 32 and ledge 34 forms a first means for sealing the opening end of the cassette 10 (see FIG. 4). The perimeter lip 60 provides a support surface for stacking an inverted cassette that is compatable with SEMI standards.

Referring to FIGS. 4, 4-B, 5, and 6 the cassette cover 24 is designed to close and seal the open top 20. Recessed around the perimeter of the cover 24 is a groove 82 that engages with a seal 23. The seal 23, preferably made of collapsable elastomer, forms a second means for sealing the open end of the cassette 10. Of course the seal 23 may be made of other acceptable materials such as plastic or rubber without deviating from the invention. When engaged, the cover 24 rests on the cassette perimeter ledge 34. Engaging the cover 24 with the semiconductor wafer cassette open end 20 engages the first and second means for sealing, thereby creating a hermetic seal.

Without limitation, the cover may be constructed with a thickness about the same as the perimeter shoulder 32 so that when the cover 24 engages with the cassette 10, a relatively flat top surface is formed. The cover may also have a means for supporting the semiconductor wafers. This means for support may be positioned to align with the apex of each recess pair when the cover is engaged with the container. These supports would prevent movement of the wafer during transportation. The cover may be constructed to engage with other surfaces of the cassette, while still forming a hermetic seal without deviating from the invention.

The present invention may be constructed with an enclosed bottom or with an open sealable bottom 58. In a cassette 10 with an open sealable bottom 58, cassette bottom inner shoulder 66 extends around the inside of the optional cassette bottom frame 26, forming a third sealing surface. The optional bottom door 18 has a seal 23 extending around the perimeter, forming a fourth sealing surface. When the bottom door 18 is engaged with the semiconductor wafer cassette bottom inner shoulder 66, a hermetic seal is created between the third and fourth means for sealing. When engaged, the bottom 18 rests on the cassette bottom perimeter ledge 80.

Best shown in FIGS. 1 and 2 are four vertical edges 36 that form the corners of the semiconductor wafer cassette 10, providing rigidity and support to the cassette. The vertical edges 36 extend upward from the lower portion of each end of the curved sides 12 to the perimeter ledge 34.

Having described the constructional features of the sealable, purgible semiconductor wafer cassette 10, the mode of use will now be discussed. With a sealed clean cassette containing semiconductor wafers, the operator of the wafer processing equipment indexes the sealed semiconductor wafer cassette 10 directly onto the processing tool. To control the particles on the exterior surface of the integrated cassette 10, the processing equipment should provide a mini-environment that allows a slight overpressure within the mini-environment to prevent the exterior environment from entering into the clean mini-environment. The mini-environment must also provide good air flow to the processing tool.

The cassette 10 may be indexed horizontally or vertically, depending on the preferred cassette orientation. Then, a processing tool with a suction and vacuum capability aligns and engages the cassette cover 24. The hermetic seal collapses allowing the process tool to remove the cover 24. Next, all the desired processes may be performed on the semiconductor wafers within the cassette. After all the desired processes have been performed, the cover 24 is then resealed by engaging the cover 24 with the cassette's perimeter ledge 34, discontinuing the vacuum and disengaging the suction. A hermetic seal is formed between the the perimeter shoulder 32, the ledge 34 and the cover's seal 23.

The cassette may then be transported to other process stations, stored or otherwise transported. During storage, the cassette may be purged with an inert gas utilizing two 0.02 micron filter PTFE membranes providing a clean environment for substrates such as semiconductor wafers 50. When the active purge is removed, the sealed cassette 10 will maintain the inert gas purge for several hours. This method allows the semiconductor wafers to be safely stored and transported in an unfriendly external environment. Also, during processing, transportation or storage, the optional tracking system 54 may be used to track the cassette in an external environment. The optional handle 56 on the endwall 14 of the cassette 10 facilitates loading and unloading a cassette into process equipment and storage areas.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed:

1. An enclosure for securely containing semiconductor wafers, said enclosure including:
   (a) a cassette having an open end and sides, said cassette including first means for supporting a plurality of semiconductor wafers;
   (b) a cover for closing the open end of said cassette;
   (c) a purging bore adapted to receive and seal with a means for purging the enclosure; and
   (d) at least a three element kinematic coupling formed on one side of said cassette for indexing said enclosure with a surface on a piece of equipment.

2. An enclosure as recited in claim 1 in which said means for supporting a plurality of semiconductor wafers further includes a plurality of pairs of opposing slots, said slots formed by a plurality of recess pairs.

3. An enclosure as recited in claim 2 in which said cover includes means aligned with said pairs of opposing slots when said cover is engaged with the cassette for further supporting said plurality of semiconductor wafers.

4. An enclosure as recited in claim 1 further including at least one handle.

5. An enclosure as recited in claim 1 further including a means for tracking said enclosure.

6. An enclosure for securely containing semiconductor wafers, comprising:
   (a) a cassette having sides and including a lip extending around the perimeter of said cassette defining an open end of said cassette, and a plurality of recess pairs formed on opposing interior surfaces of said cassette, said recess pairs forming a plurality of slots for supporting semiconductor wafers in the cassette;
   (b) a cover for closing the open end of said cassette to form a sealed chamber;
   (c) a purging bore adapted to receive and seal with a means for purging the sealed chamber; and
   (d) at least a three element kinematic coupling formed on one side of said cassette for indexing said enclosure with a surface on a piece of equipment; and
   (e) means for tracking said enclosure.

7. An enclosure as recited in claim 6 further including at least one handle.

8. A box for securely containing semiconductor wafers, comprising:
   (a) a cassette having a storage chamber, a lip extending around a perimeter of said cassette forming an open end of said chamber and a plurality of sides, at least a three element kinematic coupling formed in one side of said cassette for precisely indexing the open end of said chamber relative to a surface on a piece of equipment, means for holding a plurality of wafers in said chamber, and a first sealing means associated with the open end of said chamber;
   (b) a cover for closing the open end of said chamber, said cover including a second sealing means engagable with the first sealing means of the cassette to hermetically seal said chamber;
   (c) a purging bore adapted to receive and seal with a means for purging the chamber; and
   (d) a means for tracking said box.

9. A box as recited in claim 8 further including at least one handle.

10. An enclosure for securely containing semiconductor wafers, which is directly indexable to a processing tool, wherein the processing tool has a surface with three kinematic recesses, said enclosure comprising:
    a container having an open end, means for supporting a plurality of semiconductor wafers within said container, and projections which engage the kinematic recesses of the processing tool to form a kinematic coupling to align the open end of the container with respect to the processing tool.

11. An enclosure for securely containing semiconductor wafers, which is directly indexable to a processing tool wherein the processing tool has a surface with three kinematic projections, said enclosure comprising:
    a container having an open end, means for supporting a plurality of semiconductor wafers within said container; and
    at least three kinematic grooves formed on an external surface of said container which engage the kinematic projections of the processing tool to form a kinematic coupling to align the open end of the container with respect to the processing tool.

12. For use with equipment that stores, transports or processes substrates, a sealable, purgible enclosure, said enclosure including:
    (a) a cassette having a plurality of walls and an opening for inserting and removing said substrates;
    (b) a cover for closing said opening of said cassette to form, in combination with said cassette, a sealed chamber;
    (c) a plurality of pairs of opposing slots within said chamber for holding said plurality of substrates, each of said substrates being held by a pair of said opposing slots;
    (d) a bore in communication with said sealed chamber, said bore being adapted to receive a means for purging fluids from said sealed chamber; and
    (e) at least a three element kinematic coupling formed on one of said walls of said cassette for indexing said enclosure with said equipment.

13. The cassette of claim 12 further including an H-bar.

* * * * *